United States Patent
Palumbo et al.

(10) Patent No.: US 6,411,516 B1
(45) Date of Patent: Jun. 25, 2002

(54) COPPER SLUG PEDESTAL FOR A PRINTED CIRCUIT BOARD

(75) Inventors: Aaron Palumbo; Alex Toh; Abhay Umdekar, all of San Diego, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/882,479

(22) Filed: Jun. 15, 2001

(51) Int. Cl.[7] .................................................. H05K 7/20
(52) U.S. Cl. .................. 361/704; 29/890.032; 174/252; 228/179.1; 361/719
(58) Field of Search .......................... 29/832, 840, 842, 29/890.032; 228/37, 39, 180.1, 180.22, 179.1; 257/713, 720; 174/16.3, 263, 252; 165/80.3, 185; 361/702, 704, 705, 722, 717–719

(56) References Cited

U.S. PATENT DOCUMENTS

| | | | | |
|---|---|---|---|---|
| 4,321,423 A | * | 3/1982 | Johnson et al. | 174/16.3 |
| 4,509,096 A | * | 4/1985 | Baldwin et al. | 361/719 |
| 5,189,261 A | * | 2/1993 | Alexander et al. | 174/263 |
| 5,708,566 A | * | 1/1998 | Hunninghaus et al. | 361/704 |
| 5,779,134 A | * | 7/1998 | Watson et al. | 228/179.1 |
| 5,920,458 A | * | 7/1999 | Azar | 361/704 |
| 6,190,941 B1 | * | 2/2001 | Heinz et al. | 438/106 |

* cited by examiner

*Primary Examiner*—Gerald Tolin
(74) *Attorney, Agent, or Firm*—John T. Whelan; Michael W. Sales

(57) ABSTRACT

A printed circuit board assembly includes a printed circuit board, with a first side and a second side and at least one opening formed therebetween. The opening has a slug at least partially disposed therein and attached to the first side. The second side of the circuit board has a hot component positioned thereon and overlying the opening. A solder joint is formed between the slug and the hot component to allow dissipation of heat from the hot component.

16 Claims, 2 Drawing Sheets

COPPER SLUG PEDESTAL FOR A PRINTED CIRCUIT BOARD

TECHNICAL FIELD

The present invention relates generally to a method and apparatus for dissipating heat from one or more hot components mounted on a printed circuit board, and more particularly to a printed circuit board assembly and method of manufacturing same.

BACKGROUND ART

The satisfactory dissipation of thermal energy in hot components used on printed circuit boards has long been a difficult issue to solve. This is particularly true for the thermal energy associated with hot components used on printed circuit boards in small portable devices. Attempts to solve this problem have centered around providing an efficient heat path from the hot component to the outside of the device.

One proposed solution for providing satisfactory dissipation of thermal energy includes mounting a hot component on a metal structure such that it is in communication with an outside housing or a heat sink. One problem with this proposed approach stems from the fact that the assemblies of these hot components that are typically used have tolerances that make it difficult to guarantee good contact between the hot component and the structure. If the structure is too high, pressure can be applied to the component, which can stress the solder joints and cause electrical facture. If, on the other hand, the structure is too low, good thermal contact between the component and the structure is not typically present and thus the component can get too hot.

In these prior configurations, thermal grease or some other compliant member has been typically used to take up the tolerances between the structure and the hot component. However, thermal grease is not designed to be a filler material, but is instead designed to overcome contact resistance encountered when there is good contact force between adjacent materials. Moreover, the use of thermal grease is not a method that is preferred during the manufacturing process, and does not work well if the unit requires disassembly and reassembly. Thus, it has been determined that thermal grease is unacceptable for this purpose.

Further, other compliant members are not as conductive as thermal grease and can be difficult to assemble. Additionally, these other compliant members can put unwanted force on the hot component since they must be compressed to ensure contact, and they still introduce significant thermal resistance. Therefore, these other compliant members are unacceptable as well.

A reliable method for ensuring excellent contact between a hot component and a copper slug, which does not stress the solder joints of the components is therefore highly desirable.

SUMMARY OF THE INVENTION

It is therefore an advantage of the present invention to provide a printed circuit board assembly that ensures satisfactory dissipation of heat from any hot components disposed thereon.

It is a further advantage of the present invention to provide a printed circuit board assembly and method of manufacturing same that provides satisfactory dissipation of heat from a hot component, but does not put unwanted stress on the solder joints of the component.

In accordance with the above and other advantages of the present invention a method of attaching a hot component to a printed circuit board is provided. The printed circuit board has at least one opening formed in and extending between a first surface and a second surface. A copper slug is positioned in the opening from the first side of the circuit board and secured thereto. A hot component is positioned on the other side of the circuit board such that its underside lies over the opening. The hot component is then soldered to the circuit board such that a continuous joint is formed between the copper slug and the hot component.

Other advantages and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
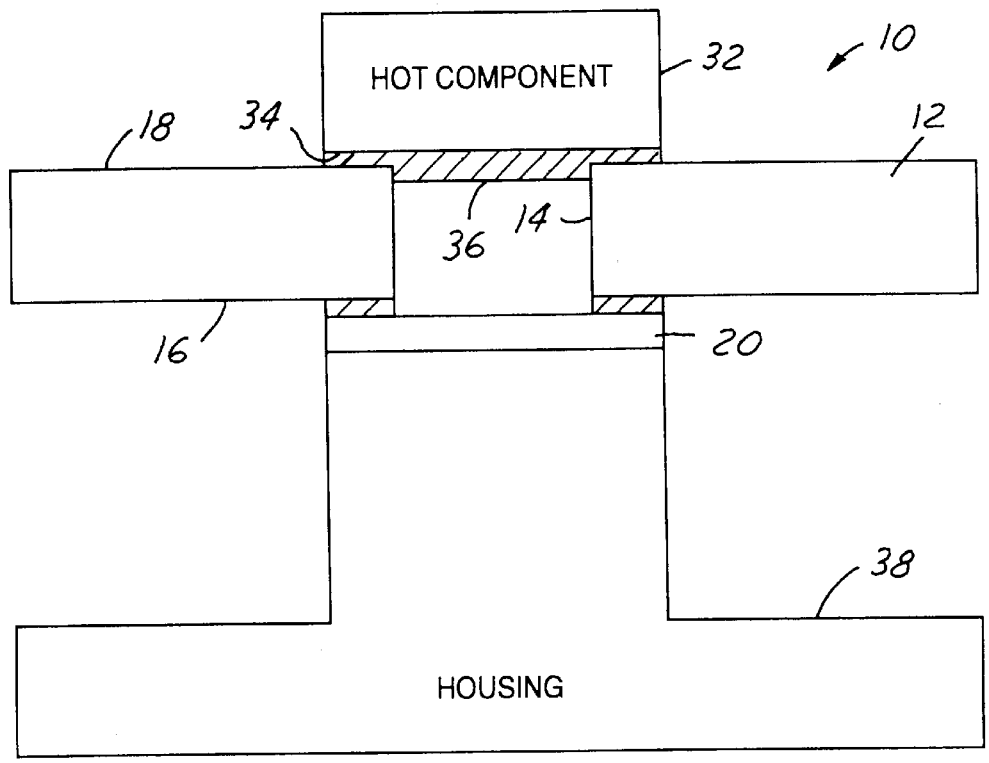
FIG. 1 is a cross-sectional view of a completed circuit board assembly in accordance with a preferred embodiment of the present invention.

Referring now to FIG. 1, which illustrates a cross-sectional view of a printed circuit board assembly 10 in accordance with the present invention. The circuit board assembly 10 includes a printed circuit board 12 with at least one opening formed therethrough. The opening 14 extends between a first side 16 and a second side 18. While only a single opening is illustrated, it will be understood that multiple openings may be formed in the circuit board. The circuit board is preferably a double-sided circuit board, however a single-sided circuit may also be utilized.

Figure 2:
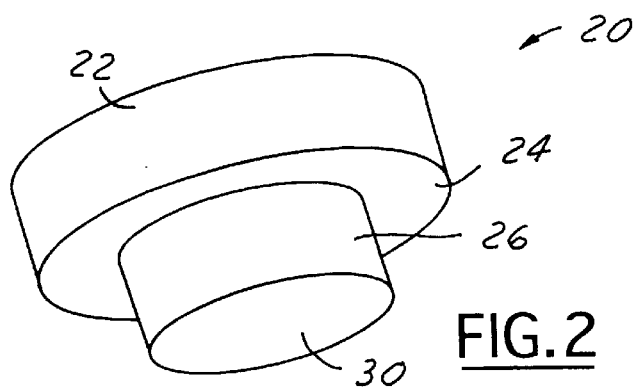
FIG. 2 is a perspective view of a copper slug in accordance with a preferred embodiment of the present invention.

The opening 14 preferably has a slug 20 inserted into the first side 16 of the circuit board 12. As shown in FIG. 2, the slug 20 has a generally circular head portion 22. The head portion 22 has a diameter that is larger than the diameter of the opening 14 so that the underside 24 of the head portion 22 would contact the first side 16 of the circuit board when the slug 20 is located in the opening 14. The slug 20 has a body portion 26 that is intended to engage the opening 14. The body portion 26 is preferably generally cylindrical in shape and is preferably shorter than the length of the opening 14 so that the end 30 of the body portion 26 lies below the second side 18. The slug 20 is preferably comprised of a copper material, however, other suitable materials may be utilized.

Once the slug 20 is located in the opening 14, a hot component 32 is positioned on the second side 18 of the circuit board 12. The hot component 32 is positioned such that an underside 34 thereof lies over the opening 14. As is discussed in more detail below, the hot component 32 is secured to the slug 20, such that a continuous joint 36 is formed therebetween. The continuous joint 36 allows heat generated by the hot component 32 to be dissipated through the slug 20 to a housing 38 which is in thermal communication with the slug 20. While a housing 38 is preferably disclosed, a heat sink or any other structure to assist in dissipating heat may be utilized.

Figure 3:
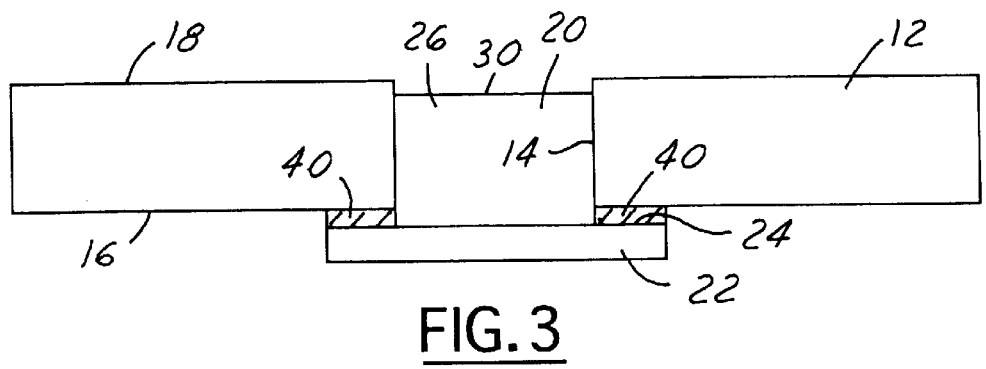
FIG. 3 is a cross-sectional view of a copper slug attached to the printed circuit board in accordance with a preferred embodiment of the present invention.
Figure 4:
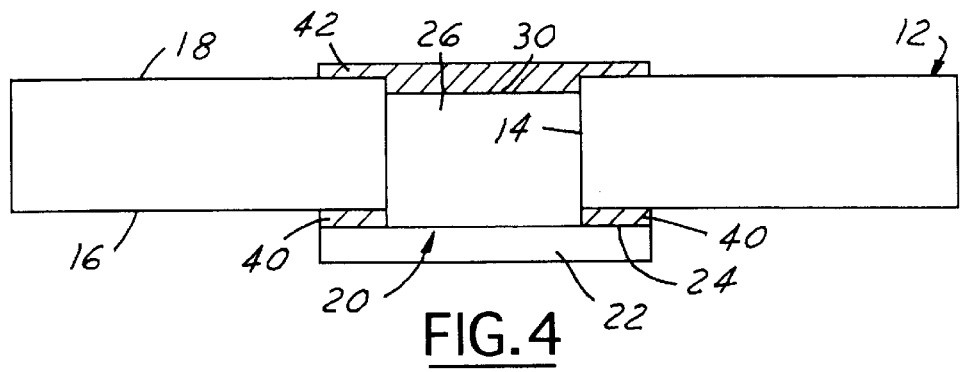
FIG. 4 is a cross-sectional view of a partial assembly of a copper slug to the printed circuit board after solder masking has been completed in accordance with a preferred embodiment of the present invention.
Figure 5:
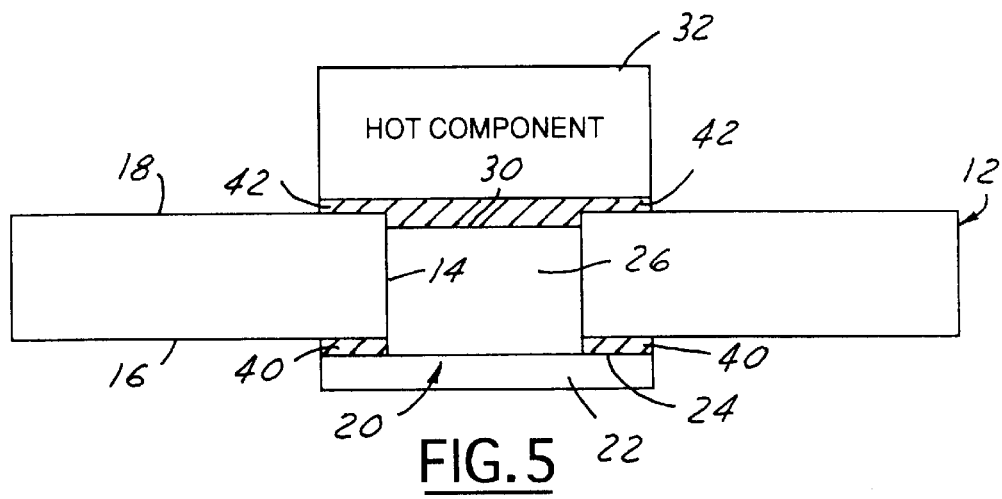
FIG. 5 is a cross-sectional view of an assembly of a copper slug to the printed circuit after completion of the reflow process in accordance with a preferred embodiment of the present invention.

Referring now to FIGS. 3 through 5, which illustrate a method of forming the printed circuit board assembly 10 in accordance with the present invention. FIG. 3 illustrates the location of the slug 20 in the opening 14 through the first side 16 of the circuit board 12. During assembly, a pick and place machine preferably places the slug 20 in the opening such that the body portion 26 is preferably located therein. Thereafter, the circuit board 12 is preferably subjected to a reflow process. The reflow process secures the slug 20 to the first side 16 of the circuit board 12 through a layer of solder 40 between the underside 24 of the head portion 22 and the first side 16. It should be understood that the slug 20 can be attached to the first side 16 by a variety of other methods, including, gluing.

After the slug 20 has been located in the opening 14 and secured to the first side 16 of the circuit board 12, the second side 18 is subjected to solder masking. By subjecting the second side 18 to solder masking, the solder will take up any tolerances associated with the end 30 of the slug 20. In other words, the solder will act to fill any gap that exists between the end 30 of the slug 20 and the second side 18 of the circuit board 12. This layer of solder that fills this gap to accommodate for any tolerances is generally indicated by reference number 42 in FIG. 4.

Figure 6:
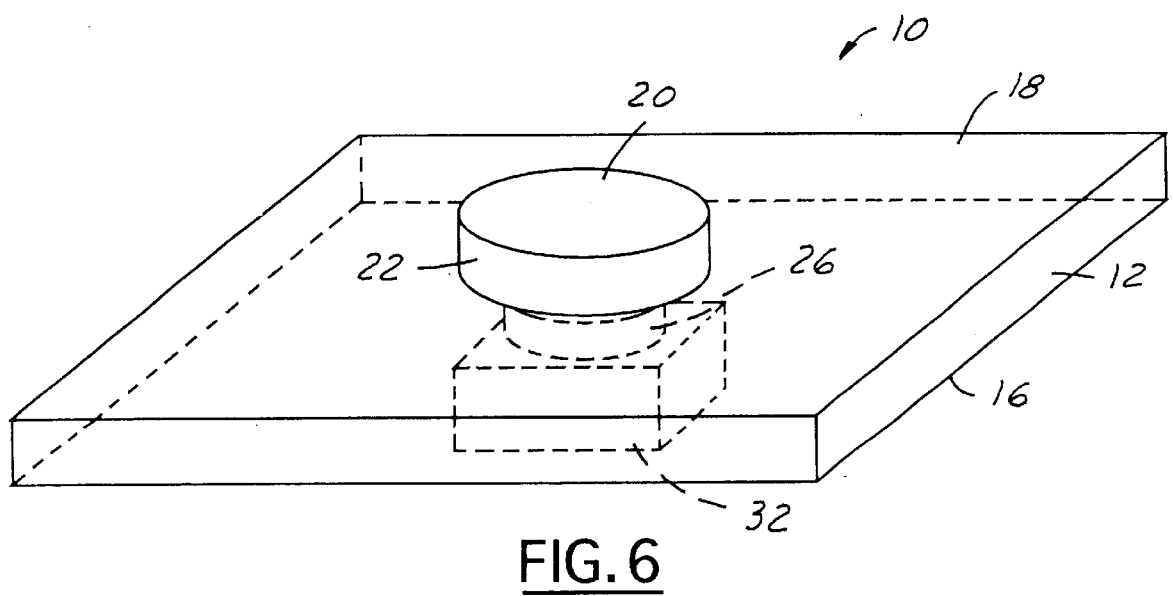
FIG. 6 is a perspective view of a completed printed circuit board assembly in accordance with a preferred embodiment of the present invention.

As shown in FIG. 5, after the second side 18 has been subjected to solder masking, the hot component 32 is located on the second side 18. The hot component 32 is positioned such that its undersigned 34 is located over the opening 14. The hot component 32 is then run through reflow such that the hot component 32 is secured to the second side 18 of the circuit board 12. The reflow process also forms a continuous solder joint 42 between the hot component 32 and the slug 20. The resulting completed assembly 10 is illustrated in FIG. 6.

Having now fully described the invention, it will be apparent to one of ordinary skill in the art that many changes and modifications can be made thereto without departing from the spirit or scope of the invention as set forth herein.

What is claimed is:

1. A method for attaching a hot component to a printed circuit board comprising:

forming an opening in the printed circuit board that extends between a first side and a second side;

positioning a copper slug in said opening from said first side of the circuit board such that said copper slug communicates with said second side of the circuit board, said copper slug having an end portion that lies in said opening slightly below said second side of the circuit board;

locating the hot component on said second side of the circuit board such that it lies over said opening so as to communicate with said copper slug;

attaching said copper slug to said first side of the circuit board; and securing the hot component to the circuit board to form a continuous joint between the hot component and said copper slug.

2. The method of claim 1, wherein the circuit board is a double-sided circuit board.

3. The method of claim 1, wherein the circuit board is a single-sided circuit board.

4. The method of claim 1, further comprising:

placing said copper slug in communication with a housing to assist in dissipating heat from the hot component.

5. The method of claim 1, wherein said positioning of said copper slug is accomplished through pick and place assembly.

6. The method of claim 1, wherein said slug is soldered to said first side of the circuit board during reflow.

7. The method of claim 1, further comprising:

solder masking said second side of the printed circuit board to take up any tolerances associated with said copper slug.

8. The method of claim 1, wherein said hot component is secured to the second side of the printed circuit board during reflow processing.

9. A printed circuit board assembly, comprising:

a printed circuit board having a first side and a second side;

at least one through opening formed in said printed circuit board which extends between said first side and said second side;

a slug disposed in said opening such that an end portion thereof lies slightly below said second side of said printed circuit board, said slug being attached to said first side;

a hot component located on said second side of said printed circuit board and overlying said opening; and a solder joint bridging a gap between end portion and said second side of said printed circuit board and connecting said slug to said hot component to allow dissipation of heat from said hot component.

10. The circuit board of claim 9, wherein said slug is constructed of a copper material.

11. The circuit board of claim 10, wherein said slug has a head portion and a body portion and wherein said body portion is disposed in said opening.

12. The circuit board of claim 11, wherein said head portion has a diameter that is larger than a diameter of said opening.

13. The circuit board of claim 9, further comprising:

a heat sink in thermal communication with said slug.

14. The circuit board of claim 9, wherein said circuit board is a double-sided circuit board.

15. The circuit board of claim 9, wherein said slug is secured to said first side of said circuit board during a reflow process.

16. The circuit board of claim 9, wherein said circuit board is solder masked to form said solder joint.

* * * * *